United States Patent [19]
Okazaki et al.

[11] Patent Number: 5,471,654
[45] Date of Patent: Nov. 28, 1995

[54] TRANSMITTING/RECEIVING UNIT HAVING AUTOMATIC GAIN CONTROL SYSTEM WITH TEMPERATURE COMPENSATION

[75] Inventors: Mitsunari Okazaki; Kazuharu Aoki, both of Soma, Japan

[73] Assignee: Alps Electric Co., Ltd., Tokyo, Japan

[21] Appl. No.: 246,585

[22] Filed: May 20, 1994

[30] Foreign Application Priority Data

May 21, 1993 [JP] Japan ................................. 5-120027

[51] Int. Cl.$^6$ ............................................ H04B 4/00
[52] U.S. Cl. .................. 455/126; 455/240.1; 455/127; 455/34; 455/234.1; 330/259; 330/256
[58] Field of Search ................................. 455/126, 127, 455/69, 84, 234.1, 239.1, 240.1, 241.1, 245.1, 249.1, 250.1; 330/289, 256, 285

[56] References Cited

U.S. PATENT DOCUMENTS

| | | | |
|---|---|---|---|
| 4,870,698 | 9/1989 | Katsuyama et al. | 455/69 |
| 5,081,708 | 1/1992 | Sacchi et al. | 455/234.1 |
| 5,107,225 | 4/1992 | Wheatley, III et al. | |

*Primary Examiner*—Edward F. Urban
*Assistant Examiner*—Doris To
*Attorney, Agent, or Firm*—Guy W. Shoup; Patrick T. Bever

[57] ABSTRACT

A transmitting/receiving unit capable of setting the level of power for transmitting an output frequency signal, which correctly correspond to the level of a received frequency signal, without dependency upon change in the environmental temperature, the transmitting/receiving unit including a signal transmitting portion; and a signal receiving portion so as to be capable of generating an output signal, the level of which depends upon the level of a received signal, wherein the signal transmitting portion includes first variable-gain amplifying means having an amplified gain which is varied by first AGC voltage, the signal receiving portion includes second variable-gain amplifying means having an amplified gain which is varied by second AGC voltage, wave-detection means for generating DC voltage which is in proportion to level of an output signal from the second variable-gain amplifying means, and temperature-dependent-type automatic gain control voltage generating means for converting the DC voltage into AGC voltage which depends upon change in environmental temperature, wherein the AGC voltages are used to compensate temperature change of the gain so that the level of the output signal is made to be constant to correspond to the level of the received signal regardless of change in the environmental temperature.

12 Claims, 12 Drawing Sheets

TRANSMITTING/RECEIVING UNIT HAVING AUTOMATIC GAIN CONTROL SYSTEM WITH TEMPERATURE COMPENSATION

BACKGROUND OF THE INVENTION

1. Field of the Invention

The present invention relates to a transmitting/receiving unit for use in, for example, a communication system between movable members, and more particularly to a transmitting/receiving unit for use in a communication system between movable members, the transmitting/receiving unit having a signal transmitting portion and a signal receiving portion, the gain of each of which can be controlled, so as to generate an output signal of an accurate level corresponding to only the level of a received input signal.

2. Description of the Prior Art

Hitherto, a transmitting/receiving unit for use in a communication system between movable members has employed a means for controlling the level of the power for transmitting an output signal to correspond to the level of a received input signal. Thus, if the level of the received input signal is too low, the power for transmitting the output signal is increased. If the level of the received input signal is too high, the level of the power for transmitting the output signal is reduced.

FIG. 8 is a block diagram which illustrates an example of the structure of a transmitting/receiving unit of the foregoing conventional type.

Referring to FIG. 8, reference numeral 50 represents a signal transmitting portion, 51 represents a signal receiving portion, 52 represents a wave divider, 53 represents an antenna, 54 represents an adder, 55 represents a first frequency-converter, 56 represents a first automatic gain control (AGC) amplifier, 57 represents a second frequency-converter, 58 represents a RF power amplifier, 59 represents a RF low-noise amplifier, 60 represents a third frequency-converter, 61 represents a second AGC amplifier, 62 represents a fourth frequency-converter, 63 represents an intermediate-frequency amplifier, 64 represents an AGC voltage generator, 65 represents a base-band signal input terminal, 66 represents a base-band signal output terminal, 67 represents a control voltage supply terminal, and 68 represents a first control-voltage supply terminal.

The signal transmitting portion 50 comprises the first frequency-converter 55 for converting a base-band signal to be supplied to the base-band signal input terminal 65 into a first RF signal, the first AGC amplifier 56 for variable-gain-amplifying the first RF signal, the second frequency-converter 57 for converting the amplified first RF signal into an output frequency signal and the RF power amplifier 58 for amplifying the power for transmitting the output frequency signal to a transmission level. The signal receiving portion 51 comprises the RF low-noise amplifier 59 for amplifying a received frequency signal, the third frequency-converter 60 for converting the thus-amplified received frequency signal into a second RF signal, the second AGC amplifier 61 for variable-gain-amplifying the second RF signal, the fourth frequency-converter 62 for converting the thus-amplified second RF signal into an intermediate frequency signal, the intermediate-frequency amplifier 63 for amplifying the intermediate frequency signal to supply the amplified signal to the base-band signal output terminal 66 and for generating DC voltage $V_{DET}$ corresponding to the output signal level of the intermediate frequency signal, and the AGC voltage generator 64 for amplifying the difference between the DC voltage $V_{DET}$ and second control voltage $V_{RREF}$ supplied to the second control voltage supply terminal 67 so as to generate second AGC voltage $V_{RAGC}$. The wave divider 52 is connected to an output terminal of the RF power amplifier 58, an input terminal of the RF low-noise amplifier 59 and the antenna 53. The adder 54 sums up the second AGC voltage $V_{RAGC}$ and first control voltage $V_{TCONT}$ to be supplied to the first control voltage supply terminal 68 so as to generate first AGC voltage $V_{TAGC}$. The first control voltage $V_{TCONT}$ and the second control voltage $V_{RREF}$ are used to set the transmission level and the receiving level, respectively.

FIG. 9 is a circuit diagram which illustrates an example of the structure of the first and second AGC amplifiers for use in the conventional transmitting/receiving unit. FIG. 9 illustrates one of a plurality of amplifying stages which respectively form the first and second AGC amplifiers.

Referring to FIG. 9, reference numeral 69 represents a first double-gate MOSFET forming one of amplifying stages of the first AGC amplifier 56, 70 represents a second double-gate MOSFET forming one of amplifying stages of the second AGC amplifier 61. The same elements as those shown in FIG. 8 are given the same reference numerals.

Each of the first and second double-gate MOSFETs 69 and 70 comprises a source S which is grounded, a first gate G1 to which a RF signal to be amplified is supplied, and a drain D which transmits the amplified RF signal. The first double-gate MOSFET 69 has a second gate G2 to which the first AGC voltage $V_{TAGC}$ is supplied. The second double-gate MOSFET 70 has a second gate G2 to which the second AGC voltage $V_{RAGC}$ is supplied.

FIG. 10 is a circuit diagram which illustrates another example of the structure of the first and second AGC amplifiers for use in the foregoing conventional transmitting/receiving unit. Also FIG. 10 illustrates one of a plurality of amplifying stages which respectively form the first and second AGC amplifiers.

Referring to FIG. 10, reference numeral 71 represents a first bipolar transistor, 72 represents a second bipolar transistor, 73 represents a third bipolar transistor, 74 represents a fourth bipolar transistor, 75 represents a fifth bipolar transistor and 76 represents a sixth bipolar transistor. The same elements as those shown in FIG. 1 are given the same reference numerals.

The first and second bipolar transistors 71 and 72 form a first difference-amplifying stage to which their emitters are connected commonly. The fourth and fifth bipolar transistors 74 and 75 form a second difference-amplifying stage to which their emitters are connected commonly. The third bipolar transistor 73 is a transistor for a first electric current source and connected between the commonly-connected emitter of the second difference-amplifying stage and the ground. Also the sixth bipolar transistor 76 is a transistor for a second electric current source and connected between the commonly-connected emitter of the second difference-amplifying stage and the ground. The first AGC voltage $V_{TAGC}$ is supplied to the base of the transistor 73 for the first electric current source, while the second AGC voltage $V_{RAGC}$ is supplied to the base of the transistor 76 for the second electric current source. Moreover, balanced RF signals are supplied to the bases of a pair of the transistors of the first and second difference-amplifying stages, thus causing amplified RF signals to be transmitted in a balanced manner from collectors.

The thus-constituted conventional transmitting/receiving unit is operated schematically as follows.

The operation of the signal transmitting portion 50 will now be described. The base-band signal supplied to the base-band signal input terminal 65 is converted into the first RF signal in the first frequency-converter 55. The thus-converted first RF signal is variable-gain-amplified in the first AGC amplifier 56. Then, the thus-amplified first RF signal is converted into an output frequency signal in the second frequency-converter 57. The power of the converted output frequency signal is amplified to an output power level in the RF power amplifier 58. Then, the output frequency signal, the power of which has been amplified as described above, is supplied to the antenna 53 through the wave divider 52 and transmitted to the air.

The operation of the signal receiving portion 51 will now be described. The frequency signal received by the antenna 53 is supplied to the RF low-noise amplifier 59 through the wave divider 52 so as to be amplified to a predetermined level. Then, the amplified received frequency signal is converted into the second RF signal in the third frequency-converter 60, the second RF signal being then variable-gain-amplified in the second AGC amplifier 61. Then, the amplified second RF signal is converted into the intermediate frequency signal in the fourth frequency-converter 62. The converted intermediate frequency signal is amplified by the intermediate-frequency amplifier 63 so as to be supplied, as the base-band signal, to the base-band signal output terminal 66. The frequency signal is as well as detected by the intermediate-frequency amplifier 63 so as to be converted into the DC voltage $V_{DET}$ corresponding to the output level of the intermediate frequency signal. At this time, the DC voltage $V_{DET}$ is supplied to the AGC voltage generator 64. In the AGC voltage generator 64, the difference between the DC voltage $V_{DET}$ and the second control voltage $V_{RREF}$ to be supplied to the second control voltage supply terminal 67 is amplified so that the second AGC voltage $V_{RAGC}$ is generated. If the level of the received frequency signal, that is, if the output signal level of the intermediate-frequency amplifier 63 is high, the level of the second AGC voltage $V_{RAGC}$ is lowered to correspond to the foregoing level. If the output signal level of the intermediate-frequency amplifier 63 is low, the level of the second AGC voltage $V_{RAGC}$ is raised to correspond to the foregoing level.

The second AGC voltage $V_{RAGC}$ is supplied to the second gate G2 of the second double-gate MOSFET 70 of the second AGC amplifier 61 having the structure shown in FIG. 9 or FIG. 10 or the base of the transistor 76 for the second electric current source. In either structure, the gain of the second double-gate MOSFET 70 or that of the second difference-amplifying stage to which the transistor 76 for the second electric current source is connected is increased if the level of the second AGC voltage $V_{RAGC}$ is high. The gain is reduced if the level is low. Therefore, if the level of the received frequency signal is high and the output signal level of the intermediate-frequency amplifier 63 is high, the second AGC voltage $V_{RAGC}$ is lowered, thus causing the gain of the second double-gate MOSFET 70 or that of the second difference-amplifying stage, that is, the gain of the second AGC amplifier 61 to be reduced. If the output signal level of the intermediate-frequency amplifier 63 is low, the second AGC voltage $V_{RAGC}$ is raised, thus causing the gain of the second double-gate MOSFET 70 or that of the second difference-amplifying stage, that is, the gain of the second AGC amplifier 61 to be increased. It should be noted that a closed loop circuit consisting of the second AGC amplifier 61, fourth frequency-converter 62, intermediate-frequency amplifier 63 and the AGC voltage generator 64 forms an automatic gain control (AGC) loop. Thus, change in the signal level of the base-band signal can be somewhat restricted even if the level of the received frequency signal is changed relatively considerably.

The second AGC voltage $V_{RAGC}$ is, in the adder 54, added to the first control voltage $V_{TCONT}$ supplied to the first control voltage supply terminal 68, thus causing the first AGC voltage $V_{TAGC}$ to be generated at the output of the adder 54. The level of the first AGC voltage $V_{TAGC}$ is raised/lowered to correspond to the change in the level of the second AGC voltage $V_{RAGC}$. When the first AGC voltage $V_{TAGC}$ is supplied to the second gate G2 of the first double-gate MOSFET 69 forming the first AGC amplifier 56 or to the base of the transistor 73 for the first electric current source, the gain of the first double-gate MOSFET 69 or that of first difference-amplifying stage to which the transistor 73 for the first electric current source is connected, that is, the gain of the first AGC amplifier 56 is, similarly to the gain of the second AGC amplifier 61, increased if the level of the first AGC voltage $V_{TAGC}$ is high. If the level is low, the gain is reduced. Therefore, if the level of the second AGC voltage $V_{RAGC}$ is lowered in a case where the level of the received frequency signal is high, the level of the first AGC voltage $V_{TAGC}$ is lowered. Therefore, the gain of the first AGC amplifier 56 is reduced. If the level of the second AGC voltage $V_{RAGC}$ is raised in a case where the level of the received frequency signal is low, also the level of the first AGC voltage $V_{TAGC}$ is raised. As a result, the gain of the first AGC amplifier 56 is increased.

As described above, the conventional transmitting/receiving unit is able to lower or raise the level of the output level of the RF output signal to be transmitted from the signal transmitting portion 50 to correspond to the rise or fall of the level of the frequency signal to be received by the signal receiving portion 51.

It has been known that an amplifier of a type comprising a semiconductor device to serve as an amplifier device thereof generally encounters change in its gain if the atmospheric temperature is changed. An amplifier of a type comprising a double-gate MOSFET or a bipolar transistor to serve as the amplifier device thereof also encounters the foregoing gain change.

FIG. 11 is a characteristic graph showing the relationship of the gain with respect to gain control voltage in a state where the atmospheric temperature is used as the parameter, the relationship being realized in an AGC amplifier using the double-gate MOSFET shown in FIG. 9.

Referring to FIG. 11, the axis of abscissa stands for gain control voltage (V) to be supplied to the second gate G2 of the double-gate MOSFET, the axis of ordinate stands for gain (db), curve a stands for the characteristics realized when the atmospheric temperature is −20° C., curve b stands for the characteristics realized when the atmospheric temperature is 25° C. and curve c stands for the characteristics when the atmospheric temperature is 80° C.

FIG. 12 is a characteristics graph showing the relationship of the gain with respect to the gain control voltage in a state where the atmospheric temperature is used as the parameter, the relationship being realized in an AGC amplifier using the bipolar transistor difference-amplifying stage shown in FIG. 10.

Referring to FIG. 12, the axis of abscissa stands for gain control voltage (V) to be supplied to the base of the transistor for the electric current source, the axis of ordinate stands for gain (db), curve a stands for the characteristics realized when the atmospheric temperature is 80° C., curve b stands for the characteristics realized when the atmospheric temperature is 25° C. and curve c stands for the characteristics when the atmospheric temperature is −20° C.

As can be understood from characteristics graphs shown in FIGS. 11 and 12, if the environmental temperature of the conventional transmitting/receiving unit is changed considerably, the gains of the first and second AGC amplifiers 56 and 61 are changed considerably as compared with the changes occurring at room temperature in the regions in which the gain control voltage is relatively large in a case where the double-gate MOSFETs 69 and 70 are used in the first and second AGC amplifiers 56 and 61. If the environmental temperature is changed from room temperature in a case where the bipolar transistors 71 to 76 are used, the gains are changed considerably over the entire range of the gain control voltage. In this case, the gains are changed more considerably in a region in which the gain control voltage is relatively small than a region in which the gain control voltage is relatively large.

As described above, if the environmental temperature is changed considerably in a case where the level of the received frequency signal is not changed, the gain of the second AGC amplifier 61 is considerably changed. As a result of the change in the gain, the level of the first AGC voltage $V_{TAGC}$ is changed as well as the level of the second AGC voltage $V_{RAGC}$. Therefore, the gain to be amplified by the first AGC amplifier 56 is changed, thus causing the level of the power for transmitting the frequency signal to be changed.

If the level of the power for transmitting the frequency signal is changed regardless of the change in the level of the received frequency signal, the correspondence between level of the received frequency signal and the level of the power for transmitting the frequency signal is disordered. As a result, the operation of the communication system between movable members encounters a problem.

SUMMARY OF THE INVENTION

The present invention is directed to overcome the foregoing problems, and therefore an object of the present invention is to provide a transmitting/receiving unit capable of setting the level of power for transmitting an output frequency signal, which correctly correspond to the level of a received frequency signal, without dependency upon change in the environmental temperature.

In order to achieve the object, according to one aspect of the present invention, there is provided a transmitting/receiving unit comprising: a signal transmitting portion; and a signal receiving portion so as to be capable of generating an output signal, the level of which depends upon the level of a received signal, wherein the signal transmitting portion includes first variable-gain amplifying means having an amplified gain which is varied by a first automatic gain control voltage, the signal receiving portion includes second variable-gain amplifying means having an amplified gain which is varied by a second automatic gain control voltage, wave-detection means for generating a DC voltage which is in proportion to a level of an output signal from the second variable-gain amplifying means, and temperature-dependent-type automatic gain control voltage generating means for converting the DC voltage into an automatic gain control voltage which depends upon a change in environmental temperature, wherein the automatic gain control voltages supplied from the temperature-dependent-type automatic gain control voltage generating means are used as first and second automatic gain control voltages to compensate temperature change of the gain so that the level of the output signal is made constant to correspond to the level of the received signal regardless of a change in the environmental temperature.

According to the foregoing structure, the temperature-dependent-type automatic gain control voltage generating means generates the output second AGC voltage $V_{RAGC}$ having temperature dependency such that the level of the output AGC voltage is raised or lowered if the environmental temperature has been raised above room temperature, and the level of the output AGC voltage is lowered or raised if the environmental temperature drops below room temperature.

By using the temperature-dependent-type automatic gain control voltage generating means having the foregoing structure, if the environmental temperature has been raised over room temperature, the gain of the first variable gain amplifying means is reduced or increased to raise or lower the level of the fist automatic gain control voltage supplied to the first variable gain amplifying means in a case where the level of the power for transmitting the frequency signal has a tendency of lowering or rising. As a result, the reduction or the increase of the gain of the first variable gain amplifying means can be compensated, thus preventing a fail or rise in the level of the power for transmitting the frequency signal. If the environmental temperature drops below room temperature, the gain of the first variable gain amplifying means is increased or reduced so that the level of the first automatic gain control voltage to be supplied to the first variable gain amplifying means is lowered or raised in a case where the level of the power for transmitting the frequency signal has a tendency of rising or lowering. Therefore, the increase or the reduction in the gain of the first variable gain amplifying means can be compensated, thus preventing rise or fall of the level of the power for transmitting the frequency signal.

As described above, employment of the first automatic gain control voltage which changes when the environmental temperature has changed always maintains the gain of the first automatic gain amplifying means even if the environmental temperature has been changed considerably. As a result, the level of the power for transmitting the frequency signal can be made constant. Therefore, in a communication system between movable members using the transmitting/receiving units of the foregoing type, the corresponding relationship between the level of the received frequency signal and the level of the power for transmitting the frequency signal cannot be disordered.

Other and further objects, features and advantages of the invention will become more apparent from the following description.

DESCRIPTION OF THE PREFERRED EMBODIMENTS

An embodiment of the present invention will now be described in detail with reference to the drawings.

Figure 1:
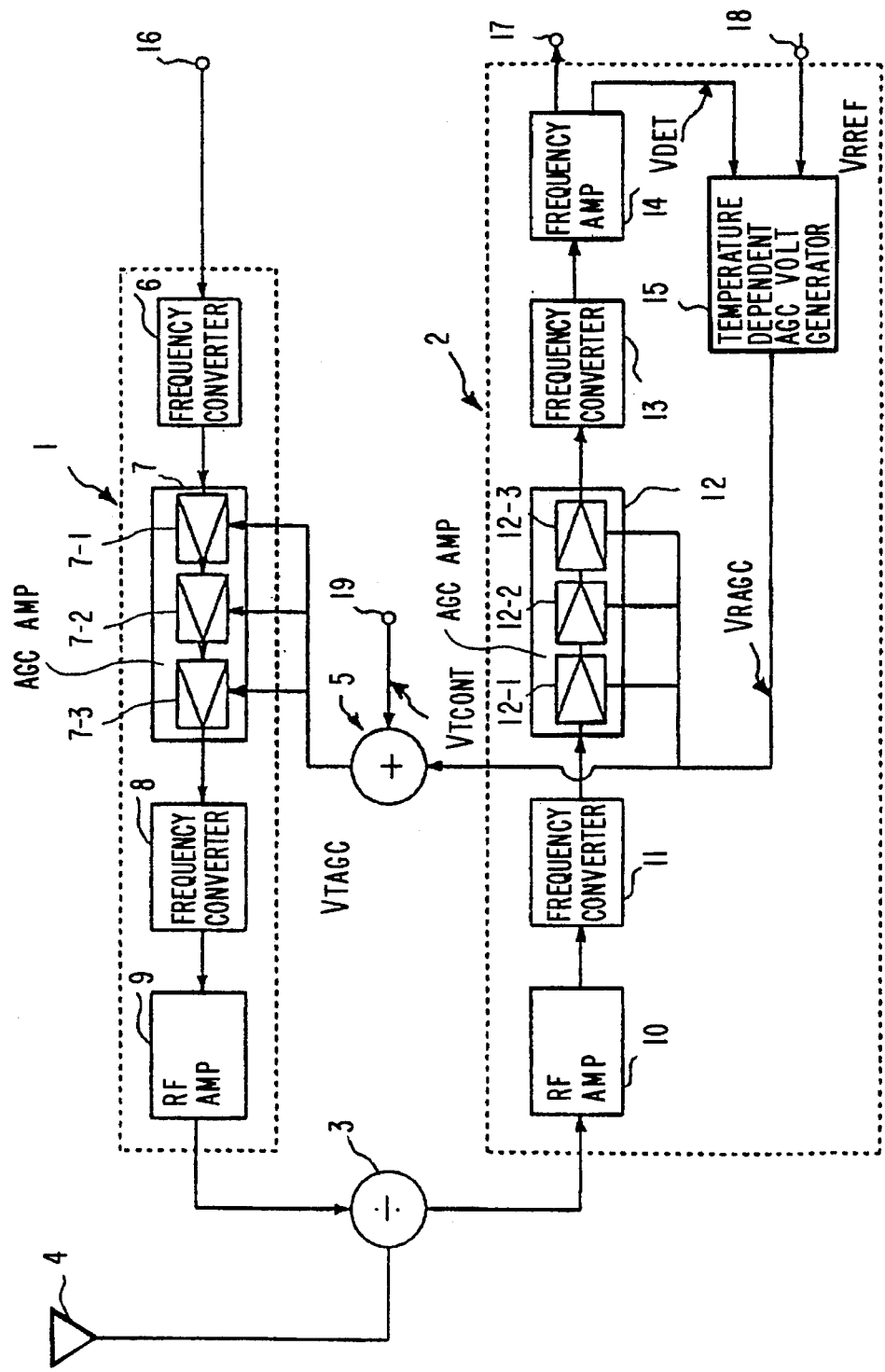
FIG. 1 is a block diagram which illustrates the schematic structure of a transmitting/receiving unit according to the present invention.

FIG. 1 is a block diagram which illustrates the outline of the structure of a transmitting/receiving unit according to the present invention.

Referring to FIG. 1, reference numeral 1 represents a signal transmitting portion, 2 represents a signal receiving portion, 3 represents a wave divider, 4 represents an antenna, 5 represents an adder, 6 represents a first frequency-converter, 7 represents a first automatic gain control (AGC) amplifier (a first variable gain amplifier means), 7-1, 7-2 and 7-3 represent AGC amplifying stages, 8 represents a second frequency-converter, 9 represents a RF power amplifier, 10 represents a RF low-noise amplifier, 11 represents a third frequency-converter, 12 represents a second AGC amplifier (a second variable gain amplifier means), 12-1, 12-2 and 12-3 represent AGC amplifying stages, 13 represents a fourth frequency-converter, 14 represents an intermediate frequency amplifier, 15 represents a temperature-dependent-type automatic gain control (AGC) voltage generating circuit, 16 represents a base-band signal input terminal, 17 represents a base-band signal output terminal, 18 represents a second control-voltage supply terminal, and 19 represents a first control-voltage supply terminal.

The signal transmitting portion 1 comprises the first frequency-converter 6 for converting a base-band signal to be supplied to the base-band signal input terminal 16 into a first RF signal, the first AGC amplifier 7 for variable-gain-amplifying the first RF signal, the second frequency-converter 8 for converting the amplified first RF signal into an output frequency signal, and the RF power amplifier 9 for amplifying the power for transmitting the output frequency signal to an output power level. The signal receiving portion 2 comprises the RF low-noise amplifier 10 for amplifying the received frequency signal, the third frequency-converter 11 for converting the amplified input frequency signal into a second RF signal, the second AGC amplifier 12 for variable-gain-amplifying the second RF signal, the fourth frequency-converter 13 for converting the amplified second RF signal into an intermediate frequency signal, the intermediate frequency amplifier 14 for amplifying the intermediate frequency signal to supply it to the base-band signal output terminal 17 and for generating DC voltage $V_{DET}$ corresponding to the output signal level of the intermediate frequency signal, and the temperature-dependent-type AGC voltage generating circuit 15 that receives the DC voltage $V_{DET}$ and second control voltage $V_{RREF}$ to be supplied to the second control voltage supply terminal 18 so as to transmit second AGC voltage $V_{RAGC}$ which changes depending upon the environmental temperature. The wave divider 3 is connected to an output terminal of the RF power amplifier 9, an input terminal of the RF low-noise amplifier 10 and the antenna 4. The adder 5 sums up the second AGC voltage $V_{RAGC}$ and first control voltage $V_{TCONT}$ to be supplied to the first control voltage supply terminal 19 to generate first AGC voltage $V_{TAGC}$ for controlling the gain of the first AGC amplifier 7. The first AGC amplifier 7 is composed-of three cascade-connected AGC amplifying stages 7-1 to 7-3. Also the second AGC amplifier 12 is composed of three cascade-connected AGC amplifying stages 12-1 to 12-3. In this case, each of the AGC amplifying stages 7-1 to 7-3 and 12-1 to 12-3 has the circuit structure arranged as shown in FIG. 9 or 10.

Figure 2:
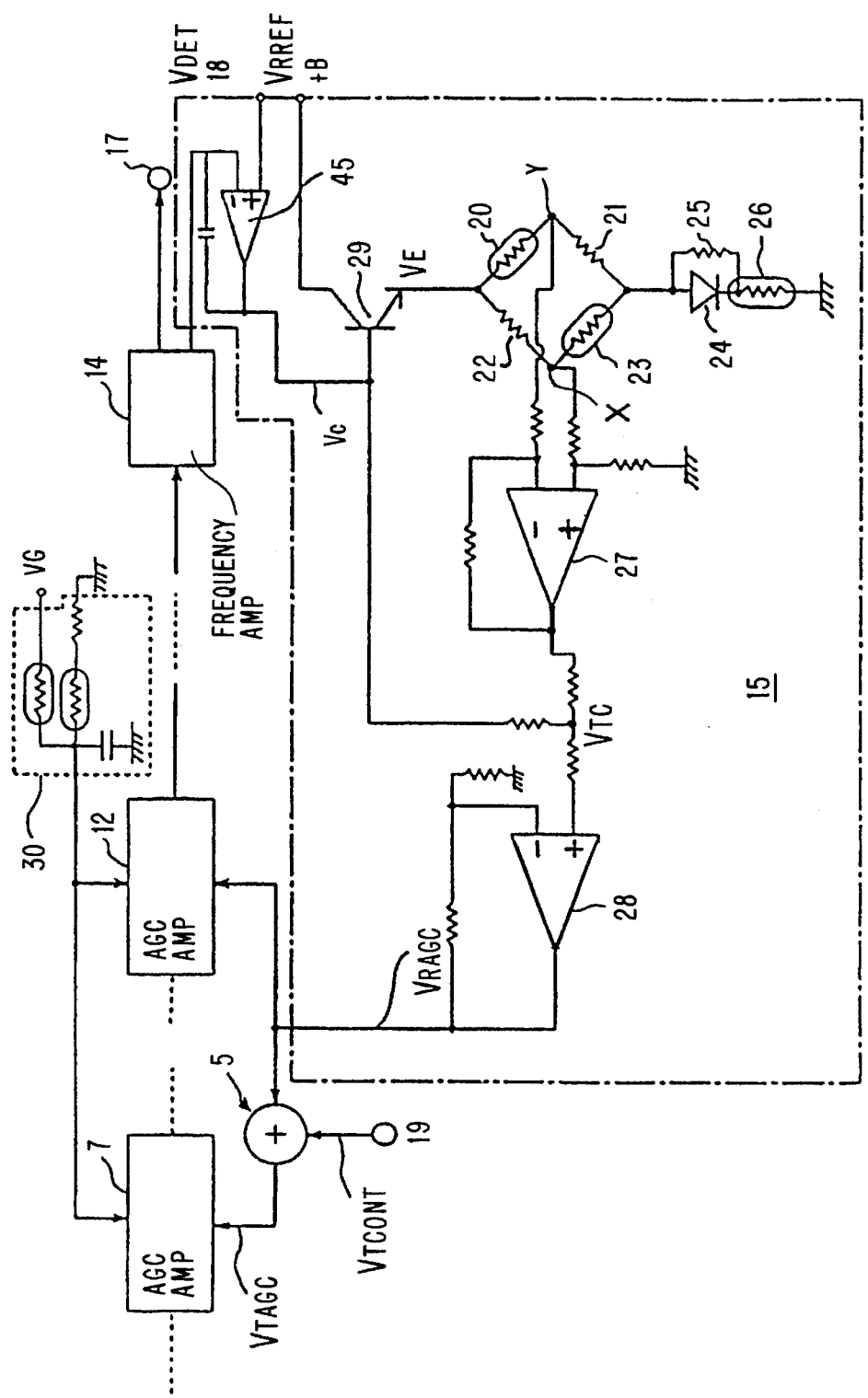
FIG. 2 is a circuit diagram which illustrates a first embodiment of a temperature-dependent-type AGC voltage generating circuit in the transmitting/receiving unit shown in FIG. 1.
Figure 9:
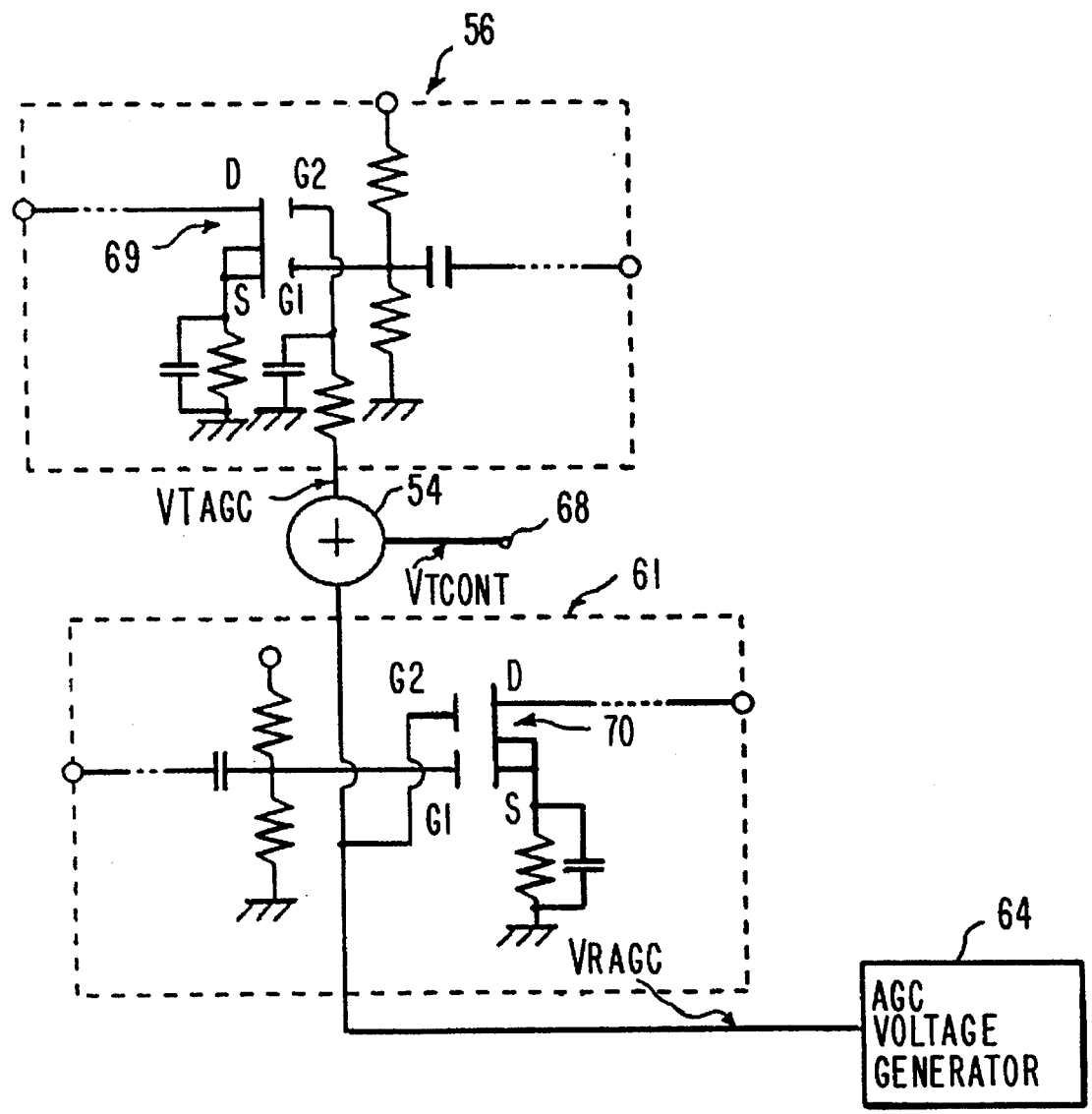
FIG. 9 is a circuit diagram which illustrates an examples of structures of first and second AGC amplifiers for use in the transmitting/receiving unit.
Figure 10:
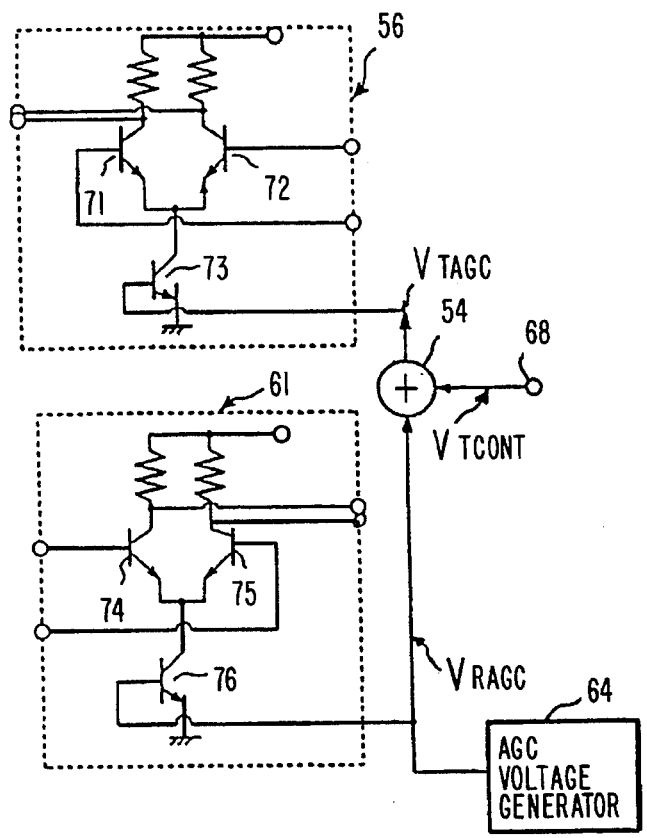
FIG. 10 is a circuit diagram which illustrates another examples of structures of first and second AGC amplifiers for use in the transmitting/receiving unit.
Figure 11:
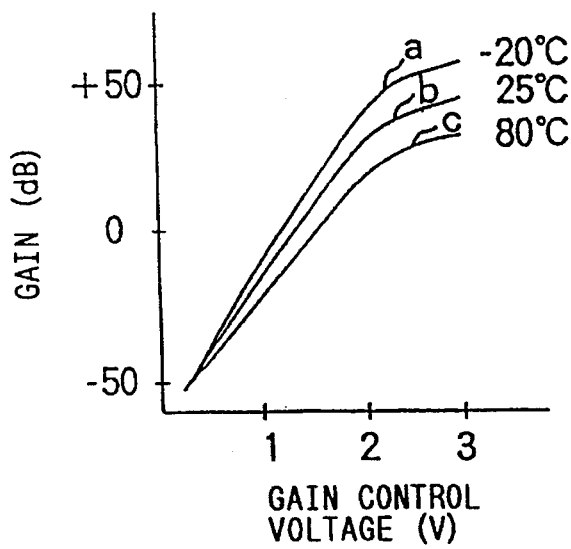
FIG. 11 is a characteristic graph which illustrates the relationship between the AGC voltage and amplified gain realized when the environmental temperature for the AGC amplifier shown in FIG. 9 has been changed.

FIG. 2 is a circuit diagram which illustrates the structure of a first embodiment of the temperature-dependent-type AGC voltage generating circuit for use in the transmitting/receiving unit shown in FIG. 1, the temperature-dependent-type AGC voltage generating circuit being employed in a case where the first and second AGC amplifiers have the structure shown in FIG. 9.

Referring to FIG. 2, reference numerals 20, 23 and 26 represent thermistors each having positive resistance temperature factor, 21, 22 and 25 represent resistors, 24 represents a diode, 27 represents a first difference amplifier, 28 represents a second difference amplifier, 45 represents an AGC control difference amplifier, 29 represents a transistor for an electric current source, and 30 represents a temperature compensating circuit for gate bias voltage. The same elements as those shown in FIG. 1 are given the same reference numerals. The AGC control difference amplifier 45 is a control amplifier for transmitting DC voltage Vc to correspond to the difference between the DC voltage $V_{DET}$ and the second control voltage $V_{RREF}$.

The two thermistors 20 and 23 and the two resistors 21 and 22 form a resistance bridge, while the diode 24, resistor 25 and the thermistor 26 form a level shift circuit. The thermistors 20 and 26, the resistors 21 and 25 and the diode 24 form a first voltage-divider. The thermistors 23 and 26, the resistors 22 and 25 and the diode 24 form a second voltage-divider. The resistance bridge is connected to a DC electric current source through the transistor 29 for the electric current source, the transistor 29 having the base to which the DC voltage Vc is supplied. Output terminals X and Y of the resistance bridge are connected to the two inputs of the first difference amplifier 27. The output from the first difference amplifier 27 is added to the voltage Vc supplied to the base of the transistor 29 and connected either input of the second difference amplifier 28. The second AGC voltage $V_{RAGC}$ is obtained at the output of the second difference amplifier 28. The first and second AGC amplifiers 7 and 12 comprise the double-gate MOSFETs 69 and 70 arranged as shown in FIG. 9. The temperature compensating circuit for the gate bias voltage includes two thermistors each having a positive resistance temperature factor. Thus, predetermined gate bias voltage is supplied to a first gate G1 of each of the MOSFETs 69 and 70.

The operation of the transmitting/receiving unit having the foregoing structure will now be described with reference to FIGS. 1 and 2.

Initially, the operation of the signal transmitting portion 1 will now be described. The base-band signal supplied to the base-band signal input terminal 16 is converted into the first RF signal in the first frequency-converter 6. The converted first RF signal is variable-gain-amplified in the first AGC amplifier 7 comprising the three AGC amplifying stages 7-1 to 7-3. Then, the amplified first RF signal is converted into an output frequency signal in the second frequency-converter 8. The power for transmitting the converted output frequency signal is amplified to an output power level in the RF power amplifier 9. Then, the output frequency signal, the power of which has been amplified, is supplied to the antenna 4 through the wave divider 3 before it is transmitted to the air. The operations to be performed until the foregoing step is completed are the same as those of the signal transmitting portion of the conventional transmitting/receiving unit.

Then, the operation of the signal receiving portion 2 will now be described. The frequency signal received by the antenna 4 is supplied to the RF low-noise amplifier 10 through the wave divider 3 so as to be amplified to a predetermined level. Then, the thus-amplified received frequency signal is converted into the second RF signal in the third frequency-converter 11. The thus-converted second RF signal is variable-gain-amplified by the second AGC amplifier 12 comprising the three AGC amplifying stages 12-1 to 12-3. Then, the amplified second RF signal is converted into an intermediate frequency signal by the fourth frequency-converter 13. The converted intermediate frequency signal is amplified by the intermediate frequency amplifier 14 so as to be supplied to the base-band signal output terminal 17 as the base-band signal and as well as wave-detected by the intermediate frequency amplifier 14 before it is converted into the DC voltage $V_{DET}$ corresponding to the output level of the intermediate frequency signal so as to be supplied to the temperature-dependent-type AGC voltage generating circuit 15.

In the temperature-dependent-type AGC voltage generating circuit 15, the DC voltage $V_{DET}$ and the second control voltage $V_{RREF}$ are supplied to the AGC control difference amplifier 45. The temperature-dependent-type AGC voltage generating circuit 15 transmits the DC voltage Vc such that the output level of the base-band signal is constant. The DC voltage Vc is supplied to the base of the transistor 29 for the electric current source, thus causing the emitter of the transistor 29 to generate DC voltage $V_E$ corresponding to the level of the DC voltage Vc. The DC voltage $V_E$ is supplied to the first and second voltage dividers including the resistance bridges. As a result, divided voltages of the first and second voltage dividers are generated at two output terminals X and Y of the resistance bridge. Then, each of the divided voltages is difference-amplified by the first difference amplifier 27 so that temperature control voltage $V_{TC}$ is generated at its output terminal. Then, the second difference amplifier 28 receives at either input (a non-inversion input) thereof and sums up the temperature control voltage $V_{TC}$ and the DC voltage Vc so that the second AGC voltage $V_{RAGC}$ is generated at its output terminal. If the environmental temperature is raised in this case, the thermistors 20 and 23 connected to the resistance bridge and each having a positive resistance temperature factor raise the divided voltage at either output terminal X of the resistance bridge, while lowering the divided voltage at the residual output terminal Y. Therefore, the temperature control voltage $V_{TC}$ to be transmitted from the first difference amplifier 27 is raised. As a result, the second AGC voltage $V_{RAGC}$ to be transmitted from the second difference amplifier 28 is raised. If the environmental temperature is lowered, the divided voltage at the output terminal X is lowered and that at the output terminal Y is raised. Therefore, the temperature control voltage $V_{TC}$ to be transmitted from the first difference amplifier 27 is lowered. As a result, also the second AGC voltage $V_{RAGC}$ to be transmitted from the second difference amplifier 28 is lowered. Thus, the output of the temperature-dependent-type AGC voltage generating circuit 15 is able to obtain, at the output thereof, the second AGC voltage $V_{RAGC}$ having temperature dependency which causes its level to be changed depending upon the environmental temperature.

Figure 3:
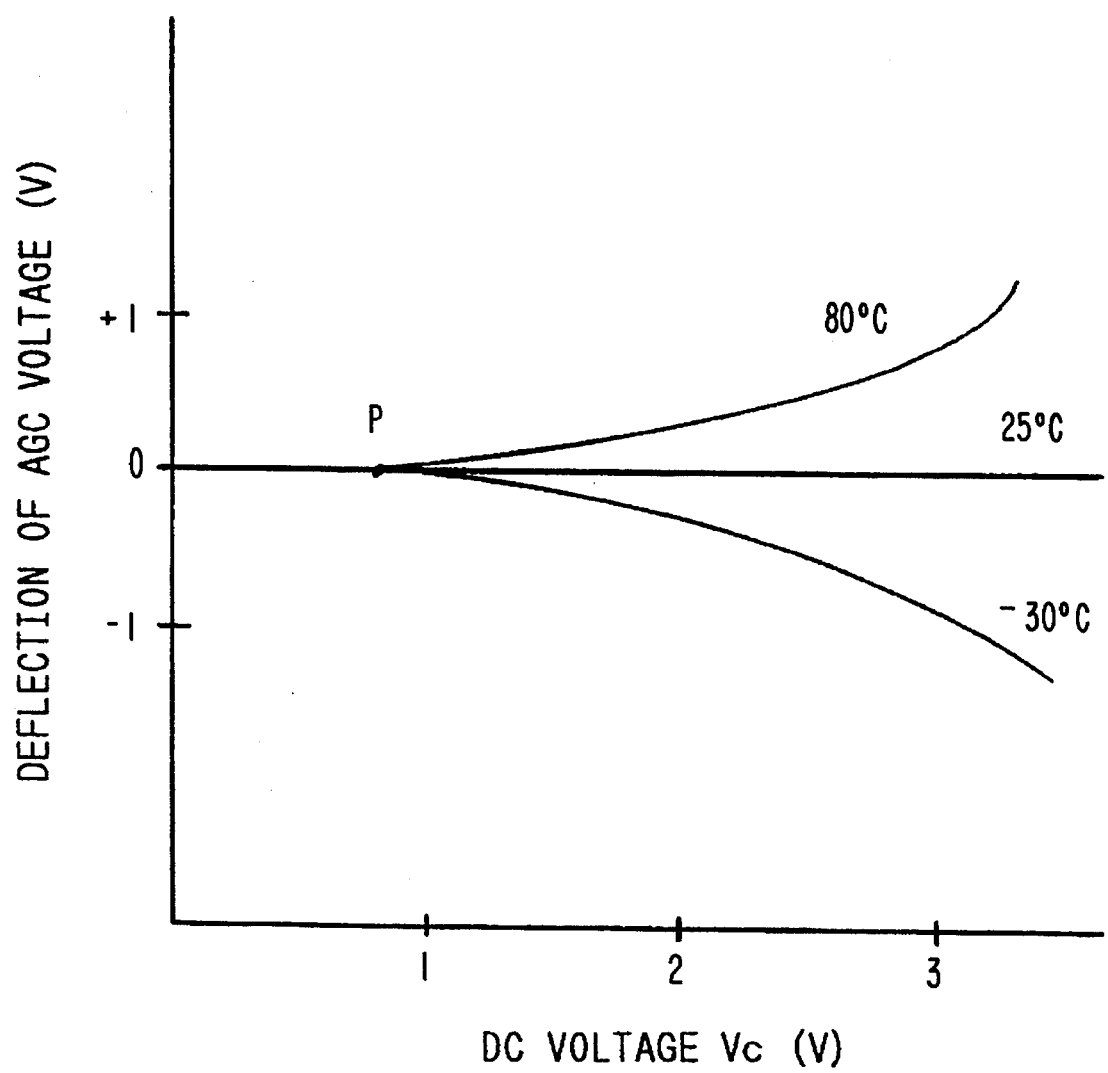
FIG. 3 is a characteristic graph which illustrates an example a deflection of second AGC voltage $V_{RAGC}$ in the temperature-dependent-type AGC voltage generating circuit shown in FIG. 2 and having temperature dependency with respect to DC voltage Vc.

FIG. 3 is a characteristics graph which illustrates an example of the deflection of the second AGC voltage $V_{RAGC}$ having the temperature dependency with respect to the DC voltage Vc in a case where the temperature is used as the parameter.

Referring to FIG. 3, in a case where the level of the received frequency signal is low and the DC voltage Vc is 0.7 V or lower (in a range lower than point P shown in FIG. 3), substantially no electric current flows in the transistor 29 and the level shift circuit. Therefore, a change in the DC voltage Vc causes a direct change in the second AGC voltage $V_{RAGC}$, thus causing the deflection of the second AGC voltage $V_{RAGC}$ to be zero. If the level of the received frequency signal has been raised and the DC voltage Vc has exceeded 0.7 V, an electric current flows in the transistor 29 and the level shift circuit. If the environmental temperature is changed at this time, the resistance values of the thermistors 20 and 23 are changed. The changes raise/lower the second AGC voltage $V_{RAGC}$ as described above. As for the voltage of the transistor 29 and that of the level shift circuit, also the deflection of the second AGC voltage $V_{RAGC}$ is changed non-linearly as the DC voltage Vc is raised because the base-emitter voltage of the transistor 29 and the junction voltage of the diode 24 are changed non-linearly. The foregoing deflection is changed non-linearly in the positive direction if the environmental temperature has been raised (for example, 80° C. as illustrated). If the environmental temperature has been lowered (for example, −30° C. as illustrated), the deflection is changed non-linearly in the negative direction.

The operation of controlling the gains of the first and second AGC amplifiers 7 and 12 by using the second AGC voltage $V_{RAGC}$ having the temperature dependency will now be described.

First, description will now be made about the operation in a case where the environmental temperature is not changed or changed slightly and the level of the received frequency signal is changed. In a case where the level of the received frequency signal is high and, therefore the level of the output signal from the intermediate frequency amplifier 14 is high, the DC voltage $V_{DET}$ is raised and the DC voltage Vc is lowered. On the other hand, the temperature control voltage $V_{TC}$ in the temperature-dependent-type AGC voltage generating circuit 15 is maintained at substantially constant. Therefore, the added output of the DC voltage Vc and the temperature control voltage $V_{TC}$ from the second difference amplifier 28, that is, the second AGC voltage $V_{RAGC}$ is lowered. If the level of the received frequency signal is low and the level of the output signal from the intermediate frequency amplifier 14 is therefore low, the second AGC voltage $V_{RAGC}$ is raised. When the second AGC voltage $V_{RAGC}$ is supplied to the second AGC amplifier 12 comprising the double-gate MOSFET shown in FIG. 9, the second AGC voltage $V_{RAGC}$ is lowered and the gain of the second AGC amplifier 12 is reduced if the level of the received frequency signal is high and the level of the signal to be amplified by the second AGC amplifier 12 is high. If the level of the received frequency signal is low and the level of the signal to be amplified by the second AGC amplifier 12 is low, the second AGC voltage $V_{RAGC}$ is raised as described above. As a result, the gain of the second AGC amplifier 12 is enlarged. If the environmental temperature is not changed or it is changed slightly and as well as the level of the received frequency signal is changed, the signal receiving portion 2 is operated similarly to the signal receiving portion 2 of the conventional transmitting/receiving unit. Therefore, the change in the level of the base-band signal can be somewhat restricted.

The second AGC voltage $V_{RAGC}$ is, by the adder 5, added to the first control voltage $V_{TCONT}$ to be supplied to the first control voltage supply terminal 19, thereby providing the first AGC voltage $V_{TAGC}$ at its output. The level of the first AGC voltage $V_{TAGC}$ is raised/lowered to correspond to the rise/fall of the level of the second AGC voltage $V_{RAGC}$. Thus, the gain of the first AGC amplifier 7 shown in FIG. 9 and comprising the double-gate MOSFET shown in FIG. 9 is enlarged if the level of the first AGC voltage $V_{TAGC}$ is high similar to the gain of the second AGC amplifier 12. If the level is low, the gain is reduced. If the second AGC voltage $V_{RAGC}$ is reduced at this time in a state where the level of the received frequency signal is high, the first AGC voltage $V_{TAGC}$ is lowered and the gain of the first AGC amplifier 7 is reduced. If the second AGC voltage $V_{RAGC}$ is raised in a state where the level of the received frequency signal is low, the first AGC voltage $V_{TAGC}$ is raised and the gain of the first AGC amplifier 7 is increased. As described above, if the environmental temperature is not changed or it is changed slightly, the operation of the signal transmitting portion 1 is made to be the same as that of the conventional transmitting/ receiving unit. Thus, an output frequency signal having an output power level in inverse proportion to the level of the received frequency signal can be transmitted.

The operation to be performed in a case where the level of the received frequency signal is substantially constant and the environmental temperature has been considerably changed will now be described. If the environmental temperature has been raised considerably, the gain of the second AGC amplifier 12 comprising the double-gate MOSFET is reduced slightly. As a result, the DC voltage $V_{DET}$ is somewhat lowered, thus causing the temperature control voltage $V_{TC}$ to be raised in the temperature-dependent-type AGC voltage generating circuit 15. When the DC voltage Vc and the temperature control voltage $V_{TC}$ are supplied to either input of the second difference amplifier 28, the second AGC voltage $V_{RAGC}$ having a characteristic (hereinafter called "a positive temperature characteristic") which is increased as the rise in the temperature changes the output of the second difference amplifier 28. The second AGC voltage $V_{RAGC}$ having the positive temperature characteristics is, in the adder 5, added to the first control voltage $V_{TCONT}$, thus generating the first AGC voltage $V_{TAGC}$. Also the first AGC voltage $V_{TAGC}$ has the positive temperature characteristic similar to the second AGC voltage $V_{RAGC}$ having the positive temperature characteristic. Therefore, even if the gain of the first AGC amplifier 7 comprising the double-gate MOSFET is slightly lowered, first AGC voltage $V_{TAGC}$ having the positive temperature characteristic is supplied to the first AGC amplifier 7 so that the reduction in the gain of the first AGC amplifier 7 occurring due to the rise in the environmental temperature is compensated. If the environmental temperature has been lowered considerably, the gain of the second AGC amplifier 12 is somewhat increased. As a result, the DC voltage $V_{DET}$ is somewhat raised and the DC voltage Vc is somewhat lowered, thereby lowering the temperature control voltage $V_{TC}$. When the DC voltage Vc and the temperature control voltage $V_{TC}$ are supplied to the second difference amplifier 28 at this time, the output of the second difference amplifier 28 is enabled to obtain the second AGC voltage $V_{RAGC}$ having the characteristic (called a "negative temperature characteristic") which is lowered as the temperature falls. The second AGC voltage $V_{RAGC}$ is, in the adder 5, converted into the first AGC voltage $V_{TAGC}$ similarly having the negative temperature characteristic. Therefore, even if the gain of the first AGC amplifier 7 has been increased due to the fall of the environmental temperature, the first AGC voltage $V_{TAGC}$ having the negative temperature characteristic is supplied to the first AGC amplifier 7. As a result, the enlargement of the gain of the first AGC amplifier 7 occurring due to the fall of the environmental temperature can be compensated.

As described above, according to this embodiment, even if the gain of the first AGC amplifier 7 and that of the second AGC amplifier 12 have been changed due to the change in the environmental temperature, the temperature-dependent-type AGC voltage generating circuit 15 generates the second AGC voltage $V_{RAGC}$ having the same temperature dependency. The first AGC voltage $V_{TAGC}$ is used to control the gain of the first AGC amplifier 7. Thus, the change in the gain of the first AGC amplifier 7 occurring due to the change in the environmental temperature can be compensated. Therefore, an output frequency signal having an output power level in inverse proportion to the level of the received frequency signal can always be transmitted.

Figure 4:
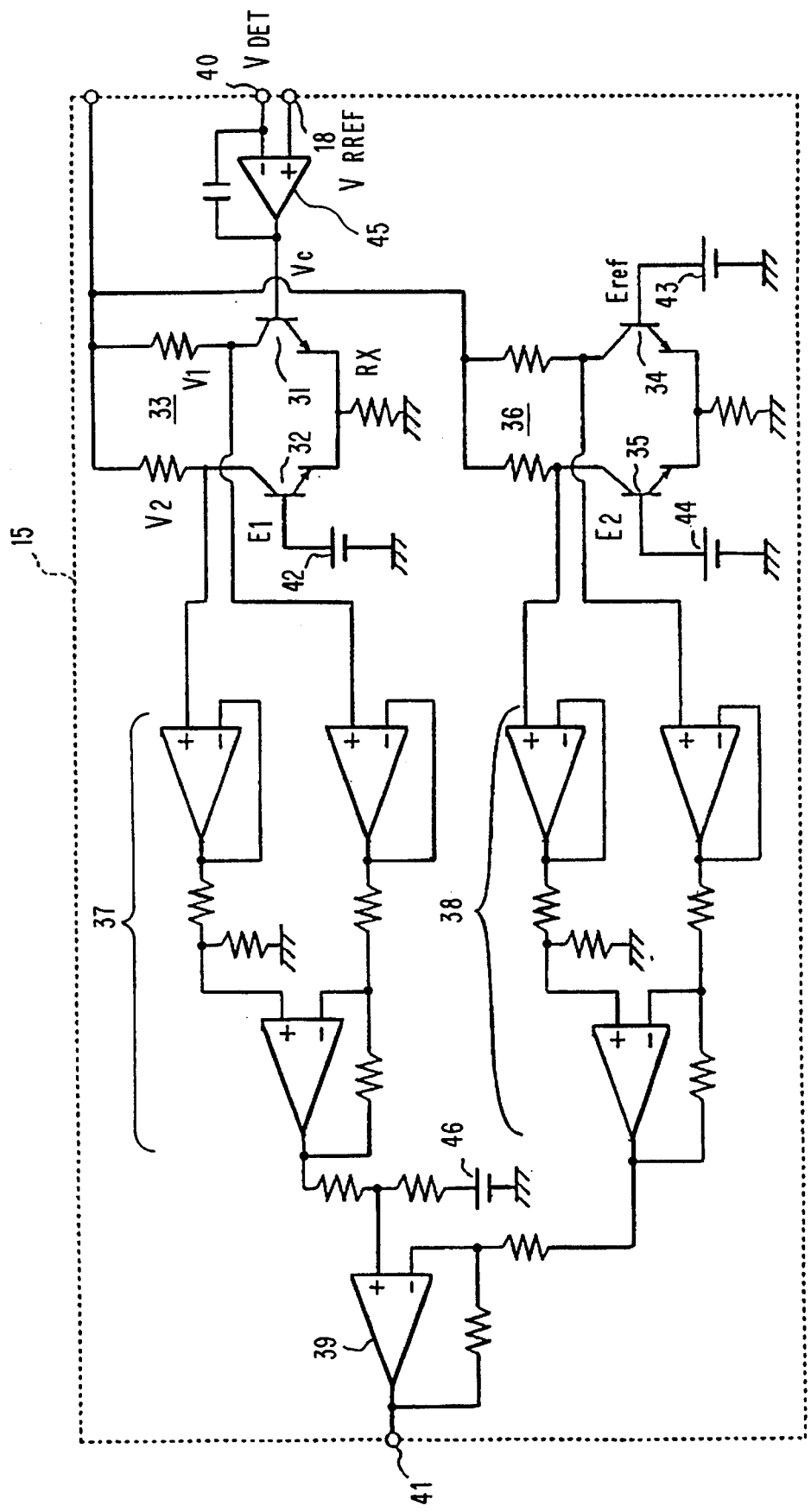
FIG. 4 is a circuit diagram which illustrates a second embodiment of the temperature-dependent-type AGC voltage generating circuit in the transmitting/receiving unit shown in FIG. 1.

FIG. 4 is a circuit diagram which illustrates a second embodiment of the temperature-dependent-type AGC voltage generating circuit 15 of the transmitting/receiving unit shown in FIG. 1. This arrangement is employed in a case where the first and second AGC amplifiers have the structure shown in FIG. 10.

Referring to FIG. 4, reference numeral 31 represents a first transistor, 32 represents a second transistor, 33 represents a first difference-amplifying stage, 34 represents a third transistor, 35 represents a fourth transistor, 36 represents a second difference-amplifying stage, 37 represents a first intermediate amplifying stage, 38 represents a second intermediate amplifying stage, 39 represents an addition amplifying stage, 40 represents a DC voltage $V_{DET}$ input terminal, 41 represents a second AGC voltage $V_{RAGC}$ output terminal, 42 represents a first bias power source, 43 represents a second bias power source, 44 represents a third bias power source, 45 represents an AGC control difference amplifier, and 46 represents a bias power source. The same elements as those shown in FIG. 1 are given the same reference numerals.

The first and second transistors 31 and 32 have commonly-connected emitter grounded through a resistor, thus forming a first difference-amplifying stage 33. The third and fourth transistors 34 and 35 have commonly-connected emitter grounded through a resistor, thus forming a second difference-amplifying stage 36. The base of the first transistor 31 is connected to an output terminal of the AGC control difference amplifier 45 for generating the DC voltage Vc. The base of the second transistor 32 is connected to the first bias power source 42 for generating fixed voltage $E_1$. The base of the third transistor 34 is connected to the second bias power source 43 for generating reference voltage $E_{ref}$. The base of the fourth transistor 35 is connected to the third bias power source 44 for generating fixed voltage $E_2$. The first intermediate amplifying stage 37 has an input connected to a pair of output terminals of the difference-amplifying stage 33. The second intermediate amplifying stage 38 has an input connected to a pair of output terminals of the second difference-amplifying stage 36. The addition amplifying stage 39 has two inputs respectively connected to the outputs of the first intermediate amplifying stage 37, the fourth bias power source 46 and the second intermediate amplifying stage 38. The output of the addition amplifying stage 39 is connected to the second AGC voltage $V_{RAGC}$ output terminal 41. The second AGC voltage $V_{RAGC}$ output terminal 41 is connected to the base of the transistor 76 for the electric current source shown in FIG. 10 and to the base of the transistor for the electric current source through the adder 54.

Figure 5:
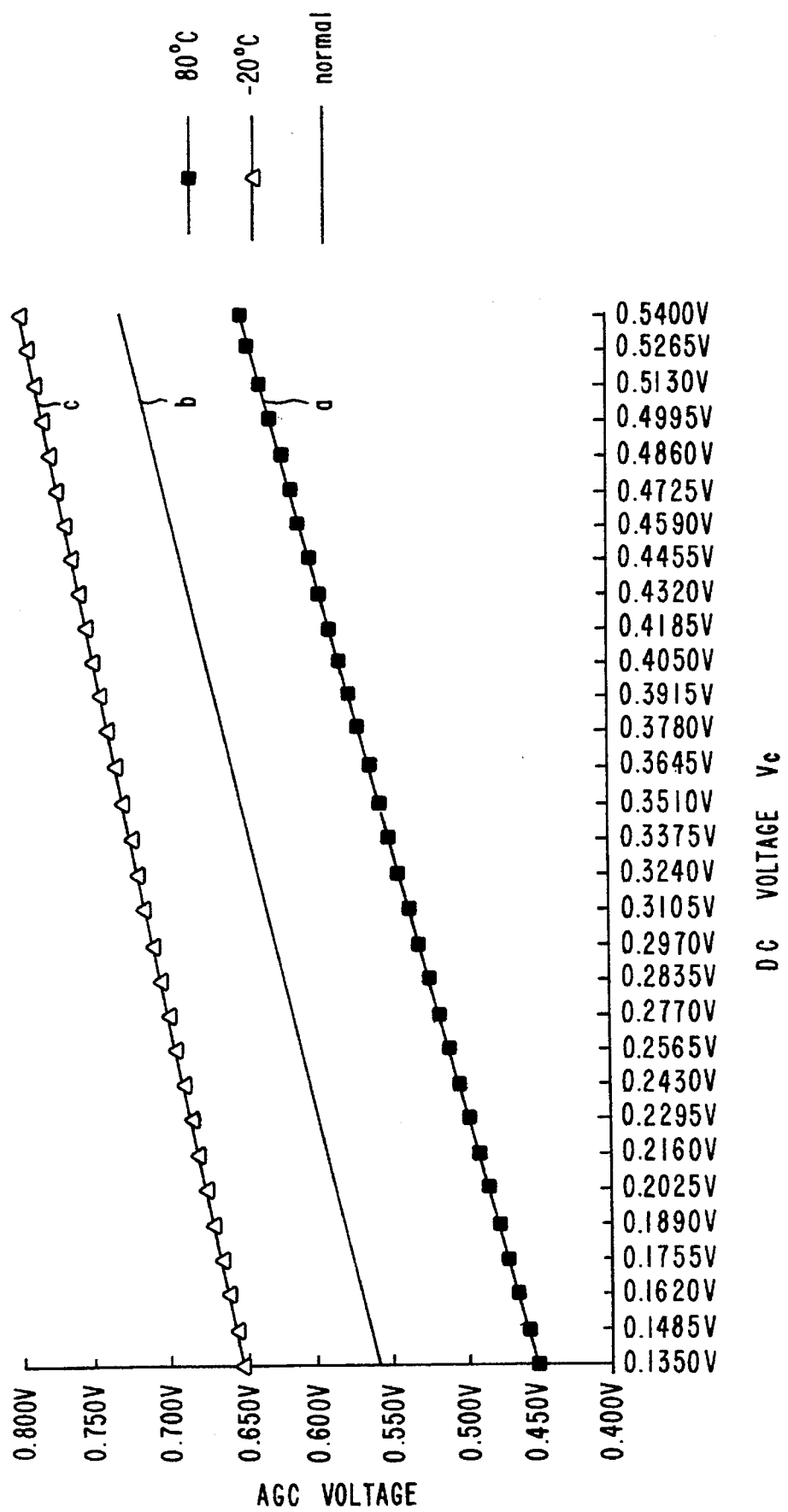
FIG. 5 is a characteristic graph which illustrates an example of the relationship of second AGC voltage $V_{RAGC}$ in the temperature-dependent-type AGC voltage generating circuit shown in FIG. 4 and having temperature dependency with respect to DC voltage Vc.
Figure 6:
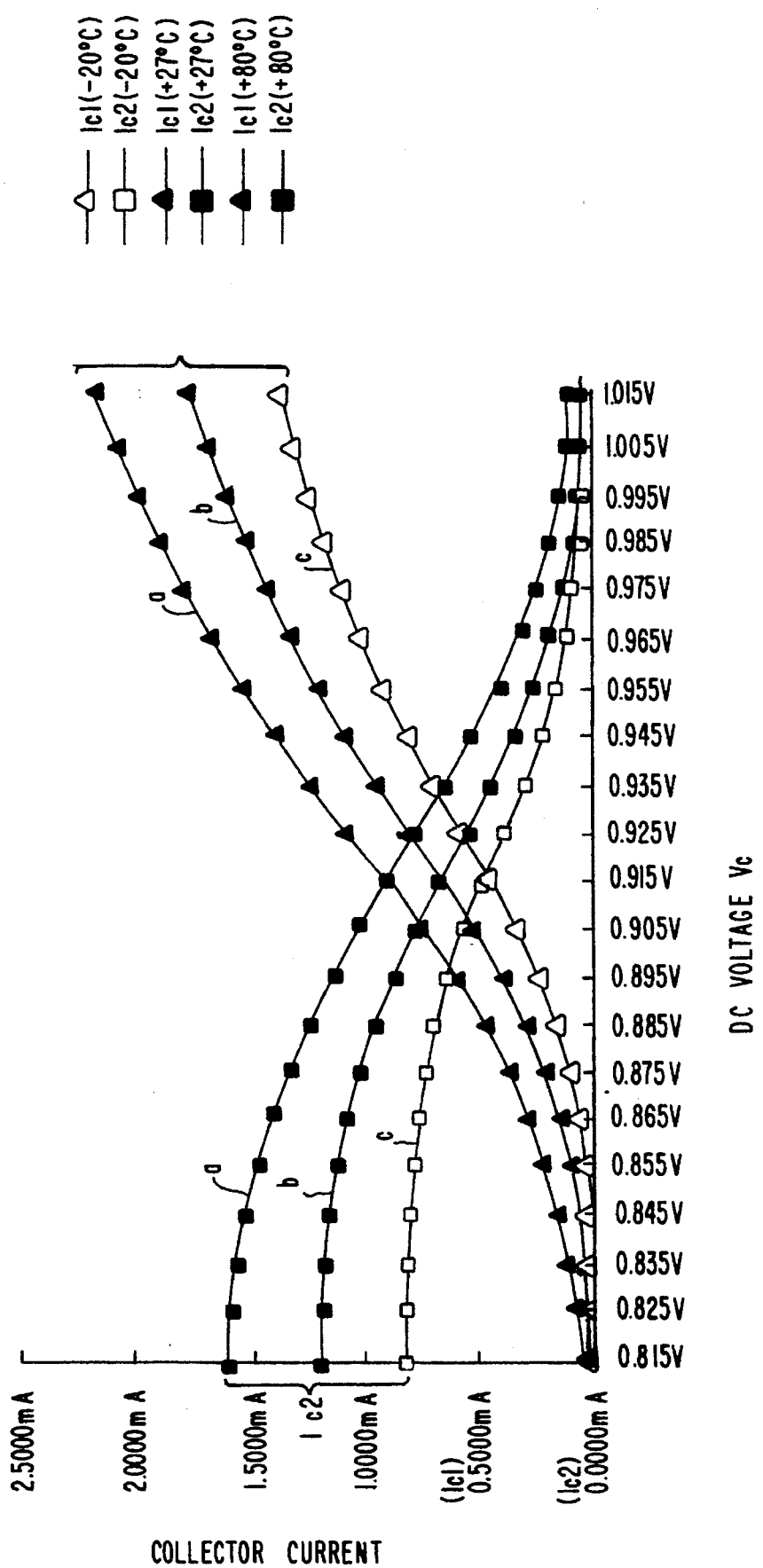
FIG. 6 is a characteristic graph which illustrates an example of the relationship of collector electric currents of two transistors of a difference amplifying stage of the temperature-dependent-type AGC voltage generating circuit shown in FIG. 4 with respect to DC voltage Vc.
Figure 7:
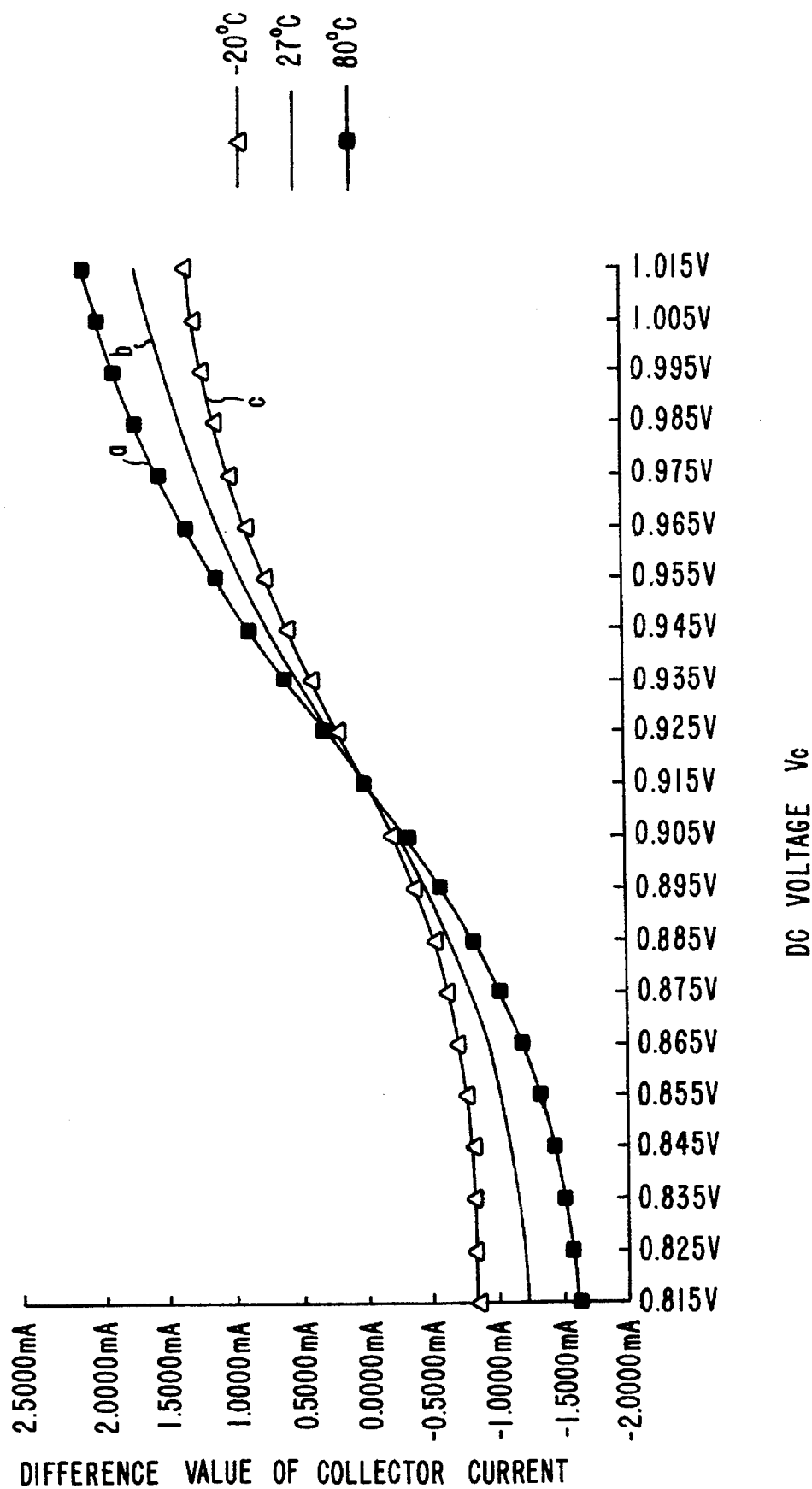
FIG. 7 is a characteristic graph which illustrates an example of the relationship of difference values of collector electric currents of two transistors of a difference amplifying stage of the temperature-dependent-type AGC voltage generating circuit shown in FIG. 4 with respect to DC voltage Vc.
Figure 8:
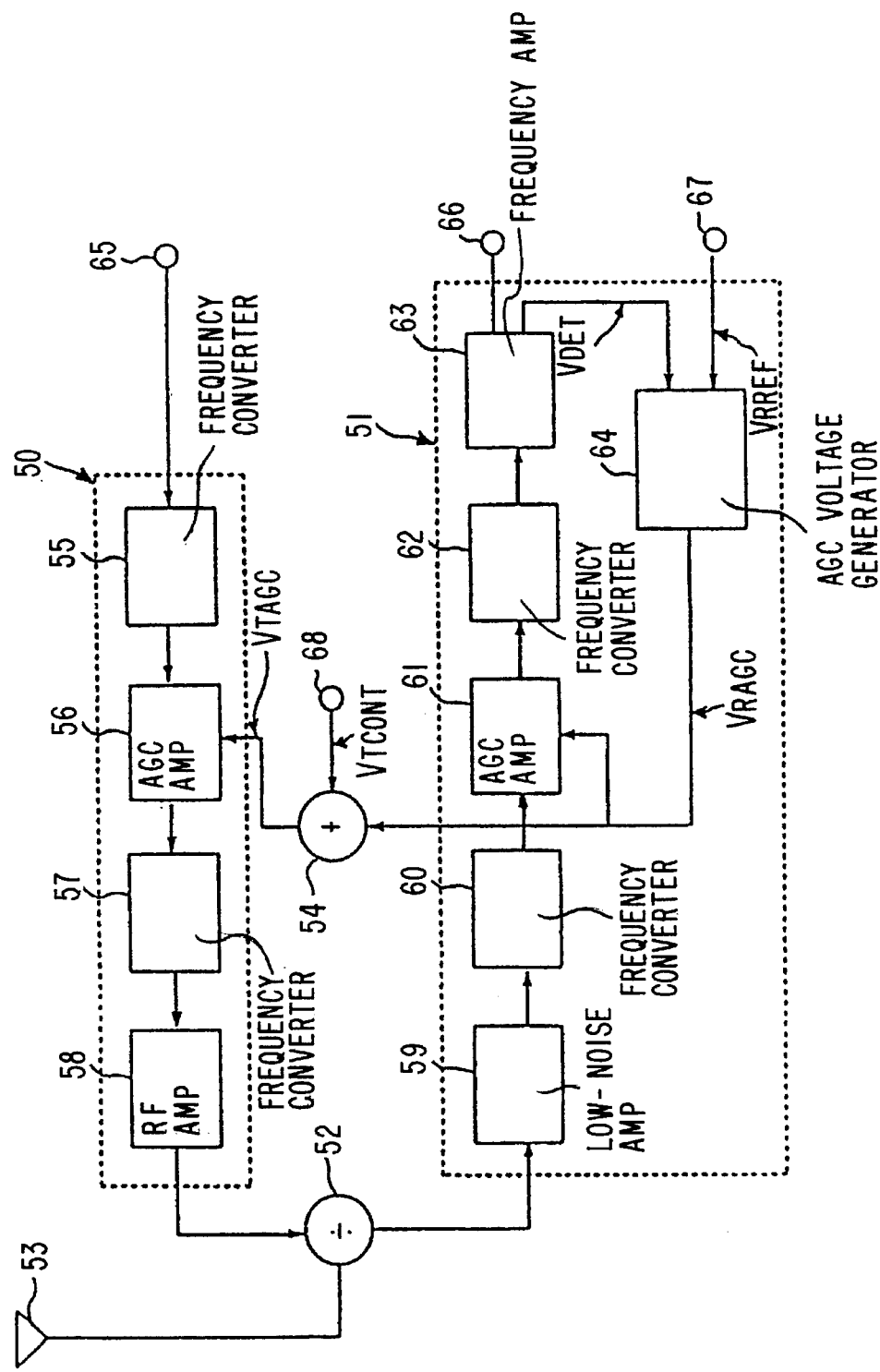
FIG. 8 is a block diagram which illustrates an example of the structure of a conventional transmitting/receiving unit.

FIGS. 5 to 7 are characteristic graphs which illustrate an example of various electric characteristics realized in the temperature-dependent-type AGC voltage generating circuit shown in FIG. 4 in a case where the temperature is used as the parameter.

FIG. 5 illustrates the relationship between the DC voltage Vc (axis of abscissa) supplied to the first difference-amplifier and the second AGC voltage $V_{RAGC}$ (axis of ordinate). FIG. 6 illustrates the relationship between the DC voltage Vc (axis of abscissa) and corrector electric current value (axis of ordinate) of the two transistors 31 and 32 of the first difference amplifying stage. FIG. 7 illustrates the relationship between the DC voltage Vc (axis of abscissa) and the difference value (axis of ordinate) of the two transistors 31 and 32 of the first difference amplifying stage, wherein a stands for the relationship at 80° C., b stands for that at room temperature (27° C.) and c stands for that at −20° C.

The operation of the thus-constituted temperature-dependent-type AGC voltage generating circuit according to this embodiment will now be described with reference to FIGS. 4 to 7.

The AGC control difference amplifier 45 transmits the DC voltage Vc to make the output of the base-band signal constant. The first difference-amplifying stage 33 amplifies the difference between the DC voltage Vc and the fixed voltage $E_1$ supplied from the first bias power source 42 so that first balanced differential voltage is obtained which is amplified by the first intermediate amplifying stage 37 and as well as converted into first imbalance voltage so as to be supplied, together with the fourth bias power source 46, to either input (the non-inverse input) of the addition amplifying stage 39. The second difference-amplifying stage 36 amplifies the difference between the reference voltage $E_{ref}$ supplied from the second bias power source 43 and the fixed voltage $E_2$ supplied from the third bias power source 44 so that second balanced differential voltage is obtained which is amplified by the second intermediate amplifying stage 38 and which is as well as converted into second imbalance voltage so as to be supplied to the residual input (the inverted input) of the addition amplifying stage 39. The addition amplifying stage 39 amplifies the difference between the first and second imbalance voltage respectively supplied to the two inputs to generate the second AGC voltage $V_{RAGC}$ at the output thereof.

Figure 12:
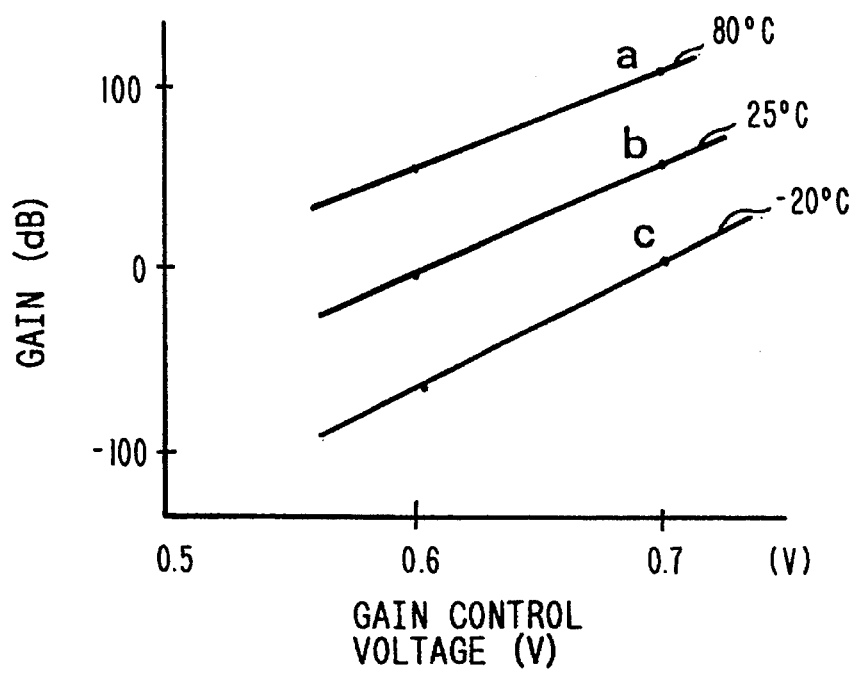
FIG. 12 is a characteristic graph which illustrates the relationship between the AGC voltage and amplified gain realized when the environmental temperature for the AGC amplifier shown in FIG. 10 has been changed.

In the case where the bipolar transistors shown in FIG. 10 are used to form the first and second AGC amplifiers 7 and 12, the gains are enlarged as the environmental temperature rises as shown in FIG. 12. On the other hand, the gain is reduced as the environmental temperature falls. Therefore, the level of the AGC voltage transmitted from the temperature-dependent-type AGC voltage generating circuit 15 according to this embodiment is lowered as the environmental temperature rises. On the other hand, the level of the voltage is raised as the environmental temperature falls. Moreover, the change (the inclination) of the AGC voltage with respect to the DC voltage Vc must be steep if the environmental temperature is high.

In the temperature-dependent-type AGC voltage generating circuit 15 according to this embodiment, the second AGC voltage $V_{RAGC}$ having the temperature dependency of the foregoing characteristic is generated as follows.

In the first difference-amplifying stage 33, the first balanced differential voltage corresponding to the DC voltage Vc and the fixed voltage $E_1$ is generated. If the collector currents flowing through the first and second transistors 31 and 32 are made to be $I_{C1}$ and $I_{C2}$ respectively, the values of the collector currents $I_{C1}$ and $I_{C2}$ are changed in the opposite directions in accordance with the level of the DC voltage Vc as shown in FIG. 6. Furthermore, the degree of the change with respect to the level of the DC voltage Vc varies depending upon the environmental temperature. The sum of the two collector currents $I_{C1}$ and $I_{C2}$, that is, $I_{C1}+I_{C2}$ is maintained within a relatively narrow range of change even if the level of the DC voltage Vc has been changed. However, the difference $I_{C1}-I_{C2}$ is changed relatively considerably as shown in FIG. 7. Furthermore, the degree of the change is the parameter of the product of value Rx of the resistor connected to the common emitter and $(I_{C1}+I_{C2})$. If they are so selected that $Rx \cdot (I_{C1}+I_{C2})<V_{BE}$, the degree of the change is made considerably if the environmental temperature has been raised and the same is restricted if the environmental temperature has been lowered. It should be noted that $V_{BE}$ is the base-emitter voltage.

If $E_1$ shown in FIG. 4 is set to 0.915 V and Vc is changed from 0.815 V to 1.015 V, the difference $I_{C1}-I_{C2}$ is changed from a negative value to a positive value as Vc is raised as can be understood from FIGS. 6 and 7. At this time, the difference $V_1-V_2$ between the collector voltage $V_1$ of the first transistor 31 and the collector voltage $V_2$ of the second transistor 32 is changed from a positive value to a negative value. The difference $V_1-V_2$ is inverted and amplified by the intermediate amplifying stage 37 and added to the non-inverted input terminal of the addition amplifying stage 39. As a result, raising of Vc results in the rise in the voltage VRAGC at the output terminal of the addition amplifying stage 39.

Then, the temperature characteristics of Vc will be discussed in two cases where it is lower than the value $E_1$, that is, 0.915 V (a first state) and where it is higher than 0.915 V (a second state). In the first state, that is, in a region in which Vc is lower than 0.915 V, the change in the temperature is reduced as Vc is raised. In the second state in which Vc is higher than 0.915 V, the change in the temperature is made to be considerable as Vc is raised. Since the relationship between the gain control voltage and the gain of the amplifier shown in FIG. 10 is, as described above, increased in a region in which the gain control voltage is relatively small as compared with the region in which the same is relatively large as shown in FIG. 12, an adequate selection of the first state enables the inclination of the temperature characteristics of the amplifier shown in FIG. 12 of the temperature compensating circuit shown in FIG. 4 to be compensated. An operation of shifting the inclination with respect to the temperature while maintaining the inclination will now be described. If the second bias power source 43 and the third bias power source 44 are so set that Eref>$E_2$ is maintained in the second difference amplifier 36, the difference $I_{C3}-I_{C4}$ between collector current $I_{C3}$ of the third transistor 34 and collector current $I_{C4}$ of the fourth transistor 35 is increased as the temperature rises. The foregoing phenomenon can be described by reading $E_1$ as $E_2$ and reading Vc as Eref. That is, by using a region in which Eref is higher than $E_2$, $I_{C3}-I_{C4}$ is enlarged as the temperature rises. Therefore, the differential voltage $V_3-V_4$ is lowered. The foregoing voltage is supplied to the inverse input of the second intermediate amplifying stage 38. Moreover, the output from the second intermediate amplifying stage 38 is supplied to the inverse input of the addition amplifying stage 39. Therefore, voltage, which is lowered as the temperature rises, can be obtained as the output from the addition amplifying stage 39. It should be noted that the fourth bias power source 46 acts to shift $V_{RAGC}$, which is supplied to the AGC amplifying stage shown in FIG. 10, to an adequate voltage level and it has no temperature dependency.

As described above, the first difference-amplifying stage 33 generates the voltage which is in proportion to Vc and having an inclination different from the temperature. Furthermore, the voltage, which is generated by the second difference-amplifying stage 36 and, which is lowered in proportion to the temperature, is added to the foregoing voltage. Thus, the voltage $V_{RAGC}$ having the characteristics shown in FIG. 5 can be obtained as the output from the addition amplifying stage 39. By supplying $V_{RAGC}$ to the AGC amplifying stage, the temperature compensation can be achieved. The foregoing relationship can be expressed by an equation as follows.

Assuming that the voltage of a signal to be supplied to the AGC amplifying stage is $e_i$, the voltage of a signal transmitted from the AGC amplifying stage is $e_o$ and the degree of amplification of the voltage in the AGC amplifying stage is Av, the following relationship is held:

$$Av = e_o/e_i \quad (1)$$

The relationship between the base voltage $V_{be}$ and the collector current Ic of the bipolar transistor is generally expressed by the following equation:

$$Ic = Is \cdot EXP\{(q/K \cdot T) \cdot V_{be}\} \quad (2)$$

where $I_s$ is a saturated electric current for the collector of the transistor, q is a quantity of a charge of an electron, K is a Boltzmann's constant, and T is temperature.

The logarithms of the degree of amplification of the voltage of the amplifier having a constant load resistance and using a bipolar transistor is taken and it is expressed by decibel, resulting in the function of $V_{be}$ and temperature change $\Delta T$ expressed as follows:

$$10 \log (Gv) = H (V_{be}, \Delta T) \quad (3)$$

If the control voltage VRAGC is added to the base of the constant electric current source 76 as shown in FIG. 10, the following relationship is held:

$$10 \log (Gv) = \bar{H} (V_{AGC}, \Delta T) \quad (4)$$

The logarithms of the degree of the amplification of the voltage of an AGC amplifier 61 and the control voltage $V_{RAGC}$ has the proportional relationship and temperature dependency, resulting as shown in FIG. 12.

By making $$\begin{aligned} V_{RAGC} &= F(Vc, \Delta T) + G(Vref, \Delta T) \\ &= K_1 * \Delta T * Vc + k_2 * \Delta T * Vref \end{aligned} \quad (5)$$

and by substituting Equation (5) into (4) to determine $k_1$, $k_2$ and Vref satisfying the following relationship, $$\begin{aligned} 10 \log (Gv) &= H(K_1 * \Delta T * vc + k_2 * \Delta T * Vref, \Delta T) \\ &= K * Vc \end{aligned} \quad (6)$$

the voltage gain 10 log (Gv) of the AGC amplifier expressed by logarithms is made to be in proportion to the control voltage Vc and has not dependency on the temperature. The foregoing relationship can be achieved as described above. It should be noted that $K_1$ and $k_2$ are proportional constants.

In the second difference-amplifying stage 36, the relationship between the reference voltage $E_{ref}$ and the fixed voltage $E_2$, specifically, if the fixed voltage $E_2$ is higher than the reference voltage $E_{ref}$, the output from the second intermediate amplifying stage 38 is reduced. If the fixed voltage $E_2$ is lower than the reference voltage $E_{ref}$, the output from the second intermediate amplifying stage 38 is increased. The foregoing voltage does not depend on the value of the DC voltage Vc but it is determined by the values of $E_2$ and Eref to be a constant level. The foregoing voltage is, together with the output from the first intermediate amplifying stage 37, supplied to the addition amplifying stage 39 in a differential manner.

Then, the addition amplifying stage 39 receives, at the non-inverse input thereof, the first imbalance voltage supplied from the first intermediate amplifying stage 37 and receives, at the inverse input thereof, the second imbalance voltage supplied from the second intermediate amplifying stage 38 to sum up the two imbalance voltages in a differential manner so as to generate the second AGC voltage $V_{RAGC}$ at the output terminal thereof. The voltage obtained at the output of the addition amplifying stage 39, that is, the second AGC voltage $V_{RAGC}$ enables the voltage of the output from the first intermediate amplifying stage 37 to be totally (without dependency on the DC voltage Vc) raised or lowered. The second AGC voltage $V_{RAGC}$ is, as shown in FIG. 5, raised when the DC voltage Vc is raised. Moreover, characteristics between the DC voltage Vc and the AGC voltage depending upon the environmental temperature and having different voltage levels and inclinations are imparted. That is, when the foregoing characteristics realized when the environmental temperature is room temperature (27° C.) are made to be the reference, characteristics having a low voltage level and steep inclination are realized when the environmental temperature is at a high level near 80° C. In a low temperature state near −20° C., characteristics having a high voltage level and moderate inclination are realized. The first difference-amplifying stage 33 acts to set the inclination of the characteristics between the DC voltage Vc and the AGC voltage, while the second difference-amplifying stage 36 acts to set the voltage level of the characteristics between the DC voltage Vc and the AGC voltage. Thus, the inclination and the voltage level are required to be determined adequately by changing the fixed voltage $E_1$ and fixed voltage $E_2$.

Figure 13:
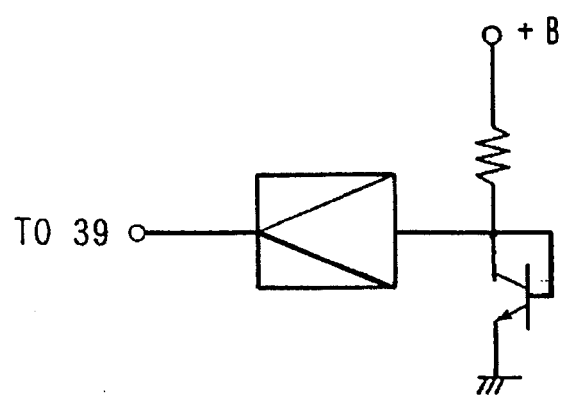
FIG. 13 is a circuit diagram which illustrates examples of the structures of the second difference amplifying stage 36 and the second intermediate amplifying stage 38 shown in FIG. 4.
Figure 14:
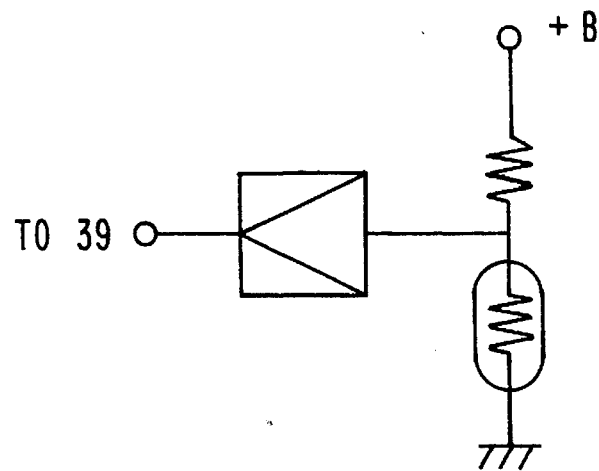
FIG. 14 is a circuit diagram which illustrates other examples of the structures of the second difference amplifying stage 36 and the second intermediate amplifying stage 38 shown in FIG. 4.
Figure 15:
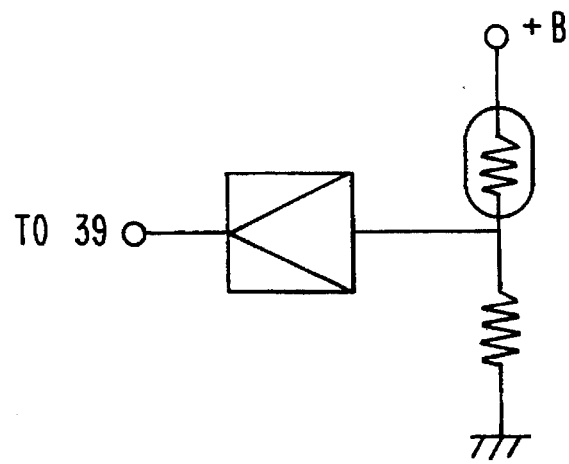
FIG. 15 is a circuit diagram which illustrates other examples of the structures of the second difference amplifying stage 36 and the second intermediate amplifying stage 38 shown in FIG. 4.

The second difference-amplifying stage 36 and second intermediate amplifying stage 38 shown in FIG. 4 may be replaced by other structures which do not depend upon the DC voltage, which depend upon the environmental temperature and which generate voltage change in a predetermined quantity. For example, the structure may be replaced by a structure as shown in FIGS. 13, 14 and 15 and formed by combining a voltage-dividing circuit including a thermosensitive device having a resistance value, which is equivalently changed depending upon the temperature of a thermistor or a semiconductor, and a conventional amplifier circuit.

As described above, the temperature-dependent-type AGC voltage generating circuit 15 according to this embodiment causes the output second AGC voltage $V_{RAGC}$ to have temperature dependency such that the voltage level is lowered as the environmental temperature rises and the voltage level is raised as the environmental temperature rises. Thus, even if the gains of the first AGC amplifier 7 and second AGC amplifier 12 are changed depending upon the change in the environmental temperature, the temperature-dependent-type AGC voltage generating circuit 15 generates the second AGC voltage $V_{RAGC}$ having the foregoing temperature dependency. The second AGC voltage $V_{RAGC}$ is used to generate the first AGC voltage $V_{TAGC}$ having similar temperature dependency. The first AGC voltage $V_{TAGC}$ is used to control the gain of the first AGC amplifier 7. Therefore, the change in the amplified gain of the first AGC amplifier 7 occurring due to the change in the environmental temperature can effectively be compensated. Thus, an output frequency signal having an output power level in inverse proportion to the level of the received frequency signal can be transmitted.

As described above, according to the present invention, the temperature-dependent-type AGC voltage generating circuit 15 is structured to generate the second AGC voltage $V_{RAGC}$ having the temperature dependency which raises or lowers the output level of the AGC voltage if the environmental temperature has been raised or lowered with respect to room temperature and which lowers or raises the output level of the AGC voltage if the environmental temperature has been lowered or raised with respect to room temperature. In accordance with the second AGC voltage $V_{RAGC}$, the first AGC voltage $V_{TAGC}$ having similar temperature dependency to the second AGC voltage $V_{RAGC}$ is generated.

If the environmental temperature has been raised or lowered with respect to room temperature, the gain of the first AGC amplifier 7 is reduced to raise or lower the level of the first AGC voltage $V_{TAGC}$ to be supplied to the first AGC amplifier 7 in a case where the level of the power for transmitting the frequency signal tends to be lowered. Therefore, the reduction in the gain of the first AGC amplifier 7 can be compensated, thus preventing lowering of the level of the power for transmitting the frequency signal. If the environmental temperature has been lowered or raised with respect to room temperature, the gain of the first AGC amplifier 7 is increased to lower or raise the level of the first AGC voltage $V_{TAGC}$ to be supplied to the first AGC amplifier 7 if the level of the power for transmitting the frequency signal tends to be raised. Therefore, the increase of the gain of the first AGC amplifier 7 can be compensated, thus preventing the rise in the level of the power for transmitting the frequency signal.

As described above, employment of the first AGC voltage $V_{TAGC}$ which changes when the environmental temperature has changed always maintain the gain of the first AGC amplifier 7 even if the environmental temperature has been changed considerably. As a result, an effect can be obtained in that the level of the power for transmitting the frequency signal can be made to be constant. Moreover, another effect can be obtained in a communication system between movable members using the transmitting/receiving units of the foregoing type that the correspondent relationship between the level of the received frequency signal and the level of the power for transmitting the frequency signal cannot be disordered.

As many apparently widely different embodiments of this invention may be made without departing from the spirit and scope thereof, it is to be understood that the invention is not limited to the specific embodiments thereof except as defined in the appended claims.

What is claimed is:

1. A transmitting/receiving unit comprising:
   a signal transmitting portion; and
   a signal receiving portion for generating an output signal,
      a level of the output signal being determined by a level of a received signal;
      wherein said signal transmitting portion includes first variable-gain amplifying means having an amplified gain which is varied in response to a first automatic gain control voltage;
      wherein said signal receiving portion includes:
         second variable-gain amplifying means having an amplified gain which is varied in response to a second automatic gain control voltage,
         wave-detection means for generating a DC voltage which is proportional to a level of an output signal generated by said second variable-gain amplifying means, and
         temperature-dependent-type automatic gain control voltage generating means for converting said DC voltage into an automatic gain control voltage which is determined by a change in environmental temperature; and
      wherein said automatic gain control voltage supplied from said temperature-dependent-type automatic gain control voltage generating means is used as said first and second automatic gain control voltages to compensate a temperature change of said gain so that said level of said output signal corresponds to said level of said received signal regardless of the change in the environmental temperature;
   wherein said temperature-dependent-type automatic gain control voltage generating means includes:
      a first voltage-divider which divides said DC voltage to generate a first divided DC voltage which is raised to correspond to a rise in the environmental temperature,
      a second voltage-divider which divides said DC voltage to generate a second divided DC voltage which is lowered to correspond to rise in the environmental temperature, and a difference amplifier for amplifying the difference between said first and second divided DC voltages to generate the automatic gain control voltage in response to the change in the environmental temperature.

2. A transmitting/receiving unit according to claim 2, further comprising a non-linear circuit for converting, into non-linear form, input/output characteristics between said DC voltage and said first and second divided DC voltages, said non-linear circuit being connected commonly to said first and second voltage-dividers.

3. A transmitting/receiving unit according to claim 2, wherein each of said first and second variable gain amplifying means includes a double-gate MOSFET having a first gate and a second gate, wherein a signal to be amplified is supplied to the first gate of said double-gate MOSFET and said automatic gain control voltage is supplied to the second gate.

4. A transmitting/receiving unit according to claim 2, wherein said DC voltage is superposed on said automatic gain control voltage.

5. A transmitting/receiving unit according to claim 4, wherein each of said first and second variable gain amplifying means includes a double-gate MOSFET having a first gate and a second gate, wherein a signal to be amplified is supplied to the first gate of said double-gate MOSFET and said automatic gain control voltage is supplied to the second gate.

6. A transmitting/receiving unit according to claim 1, wherein each of said first and second variable gain amplifying means includes a double-gate MOSFET having a first gate and a second gate, wherein a signal to be amplified is supplied to the first gate of said double-gate MOSFET and said automatic gain control voltage is supplied to the second gate.

7. A transmitting/receiving unit comprising:

a signal transmitting portion; and a signal receiving portion for generating an output signal, a level of the output signal being determined by a level of a received signal;

wherein said signal transmitting portion includes first variable-gain amplifying means having an amplified gain which is varied in response to a first automatic gain control voltage;

wherein said signal receiving portion includes:

second variable-gain amplifying means having an amplified gain which is varied in response to a second automatic gain control voltage, wave-detection means for generating a DC voltage which is proportional to a level of an output signal generated by said second variable-gain amplifying means, and temperature-dependent-type automatic gain control voltage generating means for converting said DC voltage into an automatic gain control voltage which is determined by a change in environmental temperature; and wherein said automatic gain control voltage supplied from said temperature-dependent-type automatic gain control voltage generating means is used as said first and second automatic gain control voltages to compensate a temperature change of said gain so that said level of said output signal corresponds to said level of said received signal regardless of the change in the environmental temperature;

wherein said temperature-dependent-type automatic gain control voltage generating means comprises:

a first transistor difference amplifying stage having a common emitter, a first base to which said DC voltage is supplied, and a second base to which first reference voltage is supplied, a temperature compensating voltage generating circuit including a thermosensitive device for generating a voltage which depends upon the change in the environmental temperature, and a voltage adding stage for summing output voltages from said first transistor difference amplifying stage and said temperature compensating voltage generating circuit to generate the automatic gain control voltage which depends upon the change in the environmental temperature.

8. A transmitting/receiving unit according to claim 7, wherein said temperature compensating voltage generating circuit is composed of a second transistor difference amplifying stage having a common emitter, a first base to which second reference voltage is supplied, and a second base to which a third reference voltage, having a level different from that of said second reference voltage, is supplied.

9. A transmitting/receiving unit according to claim 8, wherein each of said first and second variable-gain amplifying means uses, as amplifying devices, first and second bipolar transistors connected in a differential manner and a third bipolar transistor for generating an electric current source connected to a commonly-connected emitter of the first and second bipolar transistors and a signal to be amplified is supplied to a base of said first bipolar transistor and said first and second automatic gain control voltages are supplied to the base of said third bipolar transistor.

10. A transmitting/receiving unit according to claim 7, wherein said temperature compensating voltage generating circuit is composed of a voltage-dividing circuit comprising at least one of a thermistor, a transistor and a resistor.

11. A transmitting/receiving unit according to claim 10, wherein each of said first and second variable-gain amplifying means uses, as amplifying devices, first and second bipolar transistors connected in a differential manner and a third bipolar transistor for generating an electric current source connected to a commonly-connected emitter of the first and second bipolar transistors and a signal to be amplified is supplied to a base of said first bipolar transistor and said first and second automatic gain control voltages are supplied to the base of said third bipolar transistor.

12. A transmitting/receiving unit according to claim 7, wherein each of said first and second variable-gain amplifying means uses, as amplifying devices, first and second bipolar transistors connected in a differential manner and a third bipolar transistor for generating an electric current source connected to a commonly-connected emitter of the first and second bipolar transistors and a signal to be amplified is supplied to a base of said first bipolar transistor and said first and second automatic gain control voltages are supplied to the base of said third bipolar transistor.

* * * * *